United States Patent
Auciello

(10) Patent No.: US 8,424,175 B2
(45) Date of Patent: Apr. 23, 2013

(54) PROCESS FOR FABRICATING PIEZOELECTRICALLY ACTUATED ULTRANANOCRYSTALLINE DIAMOND TIP ARRAY INTEGRATED WITH FERROELECTRIC OR PHASE CHANGE MEDIA FOR HIGH-DENSITY MEMORY

(75) Inventor: Orlando H. Auciello, Bolingbrook, IL (US)

(73) Assignee: UChicago Argonne, LLC, Argonne, IL (US)

( * ) Notice: Subject to any disclaimer, the term of this patent is extended or adjusted under 35 U.S.C. 154(b) by 573 days.

(21) Appl. No.: 12/556,771

(22) Filed: Sep. 10, 2009

(65) Prior Publication Data

US 2010/0055806 A1    Mar. 4, 2010

Related U.S. Application Data

(62) Division of application No. 11/789,344, filed on Apr. 24, 2007, now Pat. No. 7,602,105.

(51) Int. Cl.
   *H04R 17/10* (2006.01)
   *H04R 31/00* (2006.01)

(52) U.S. Cl.
   USPC .............. 29/25.35; 29/594; 29/847; 29/841; 438/643; 438/701

(58) Field of Classification Search .................. 29/25.35, 29/594, 841, 847; 438/608, 643, 696, 701; 310/311, 365, 324, 328
   See application file for complete search history.

(56) References Cited

U.S. PATENT DOCUMENTS

| | | | | |
|---|---|---|---|---|
| 5,129,132 | A | * | 7/1992 | Zdeblick et al. ............. 29/25.35 |
| 6,313,539 | B1 | * | 11/2001 | Yokoyama et al. ....... 438/608 X |
| 6,613,601 | B1 | | 9/2003 | Krauss et al. |
| 2002/0149019 | A1 | | 10/2002 | Iwashita et al. |
| 2007/0220959 | A1 | | 9/2007 | Sumant et al. |
| 2008/0310052 | A1 | | 12/2008 | Strom |
| 2009/0116367 | A1 | | 5/2009 | Gidon |

FOREIGN PATENT DOCUMENTS

JP    10051041  A  *  2/1998

OTHER PUBLICATIONS

Publication: Takayuki Shibata, et al., "Diamond AFM Probe with Piezoelectric Sensor and Actuator", Transducers '03, The 12th International Conference on Solid State Sensors.
Actuators and Microsystems, Boston, Jun. 8-12, 2003, pp. 500-503.

* cited by examiner

*Primary Examiner* — A. Dexter Tugbang
(74) *Attorney, Agent, or Firm* — Thomas W. Tolpin; Tolpin & Partners, PC

(57) ABSTRACT

A process for fabricating a piezoactuated storage device having a tip array and a memory media, which includes but is not limited to: etching the regions on the surface of the silicon wafer to produce substantially pyramidal etch pits by anisotropic etching or chemical etching with potassium hydroxide (KOH); growing an oxide layer on a top surface of the silicon wafer and in the substantially pyramidal etch pits to produce oxidation sharpening of the substantially pyramidal etch pits; forming an array of conductive tips of a nanocarbon film of nanostructured carbon material by deposition, wherein the nanostructured carbon material is ultrananocrystalline diamond (UNCD), ta-C, or diamond-like carbon films; and forming an oxygen diffusion barrier layer by deposition of a TiAl, TaAl, or any other oxygen diffusion barrier layer material on the nanocarbon film.

4 Claims, 2 Drawing Sheets

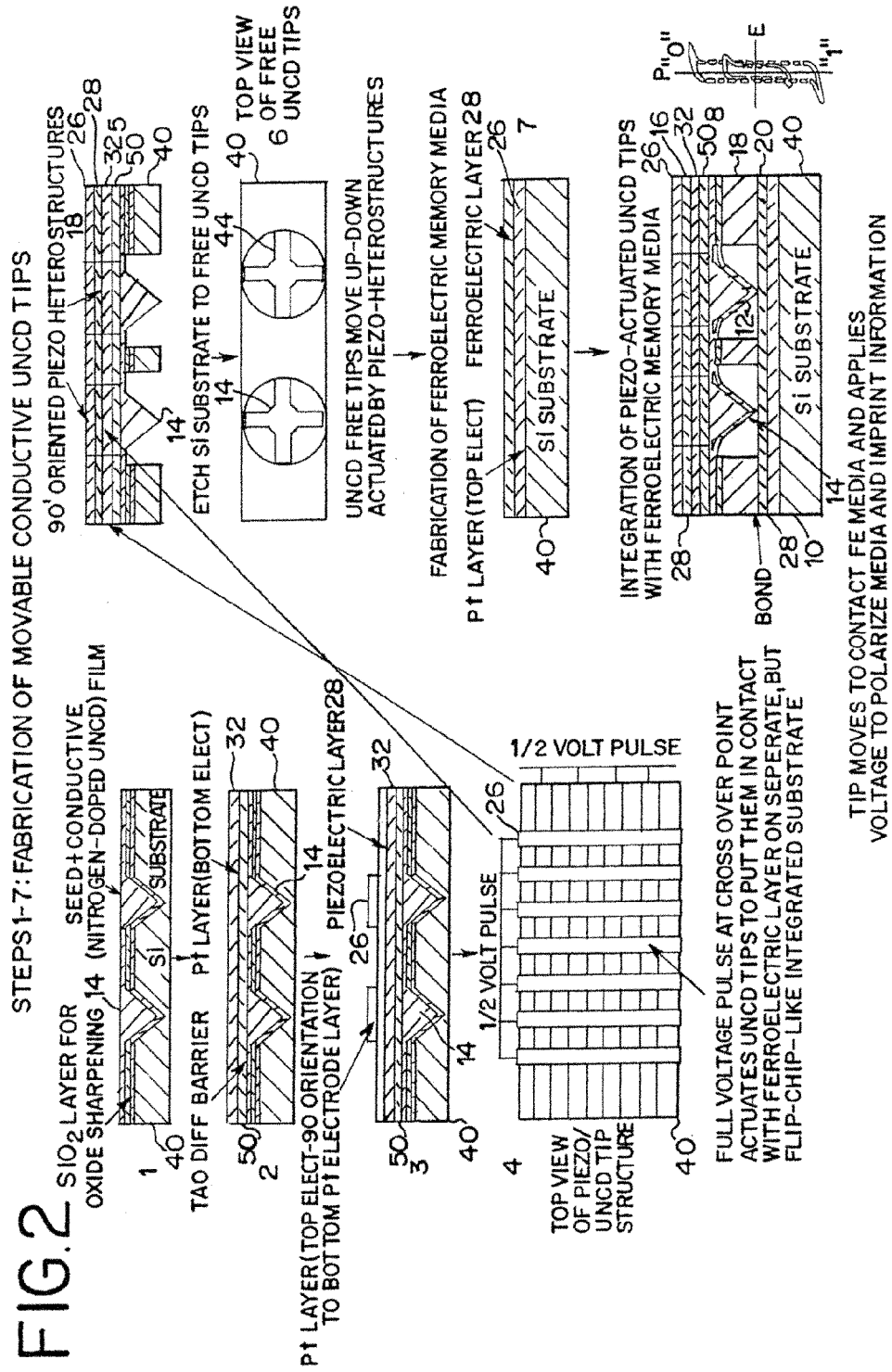

PROCESS FOR FABRICATING PIEZOELECTRICALLY ACTUATED ULTRANANOCRYSTALLINE DIAMOND TIP ARRAY INTEGRATED WITH FERROELECTRIC OR PHASE CHANGE MEDIA FOR HIGH-DENSITY MEMORY

CROSS REFERENCES TO RELATED APPLICATIONS

This application is a division of U.S. Pat. No. 7,602,105, issued Oct. 13, 2009, U.S. patent application Ser. No. 11/789,344, filed Apr. 24, 2007.

STATEMENT REGARDING FEDERALLY SPONSORED RESEARCH OR DEVELOPMENT

The United States Government has rights in this invention pursuant to Contract No. W-31-109-ENG-38 between the United States Government and The University of Chicago and/or pursuant to Contract No. DE-AC02-06CH11357 between the United States Government and UChicago Argonne, LLC representing Argonne National Laboratory.

BACKGROUND OF THE INVENTION

This invention relates to high density memory, and more particularly, to a piezoelectrically actuated ultrananocrystalline diamond tip array integrated with ferroelectric or phase change media.

Electronic memory is useful to input, store and read information, such as data, graphics, videos, etc. Data, graphics, photographs, charts, videos, movies, and internet downloads often require substantial electronic memory. Many stand alone memories and embedded memories for multifunctional electronic devices, such as cell phones with image, video, and voice recording, portable movie systems, computers, and hand held electronic devices and other systems require high-density memories in the gigabit (Gb) to terabit (Tb) range. A gigabit is a unit of information or computer storage, abbreviated Gb. One (1) gigabit=109=1,000,000,000 bits (which is equal to 125 decimal megabytes as 8 bits equals one byte). A terabit is a unit of information or computer storage, abbreviated Tb. One (1) terabit=1012 bits=1,000,000,000,000 bits.

Computer memory and storage refer to computer components, devices and recording media that retain data for some interval of time. Computer storage provides one of the core functions of a computer, that of information retention. Memory often refers to a form of solid state storage known as random access memory (RAM) and sometimes other forms of fast but temporary storage. In computers, for example, the main memory is the electronic solid-state random access memory. Random access means that any location in storage can be accessed at any moment in the same, usually small, amount of time. This makes random access memory well suited for primary storage. RAM is directly connected to the central processing unit memory bus and a data bus. RAM can very quickly transfer information between a processor register and locations in main storage, also known as a memory addresses. The memory bus is also called an address bus or front side bus and both busses are high-speed digital superhighways. Access methods and speed are two of the fundamental technical differences between memory and mass storage devices.

Memory can be split into two main categories: volatile and nonvolatile. Volatile memory loses data as soon as the system is turned off and requires constant power to remain viable. Most types of random access memory (RAM) fall into this category. Dynamic random access memory (DRAM) is a type of random access memory that stores each bit of data in a separate capacitor within an integrated circuit. Since real capacitors leak charge, the information eventually fades unless the capacitor charge is refreshed periodically. Since DRAM loses its data when the power supply is removed, it is in the class of volatile memory devices.

Non-volatile memory will retain the stored information even if it is not constantly supplied with electric power. It is suitable for long-term storage of information. Examples of non-volatile memory include read-only memory, flash memory, most types of magnetic computer storage devices (e.g. hard disks, floppy disk drives, and magnetic tape), optical disc drives, and the new generation of non-volatile ferroelectric random access memories, now in the market in "smart cards" and RFID devices, and the upcoming phase change memories. Storage often refers to mass storage—optical discs, forms of magnetic storage like hard disks, and other types of storage which are slower than RAM, but of a more permanent nature. Off-line storage is used for data transfer and archival purposes. In computers, compact discs, DVDs, memory cards, flash memory devices including USB drives, floppy disks, Zip disks and magnetic tapes are commonly used for off-line mass storage purposes.

Flash memory is a form of non-volatile computer memory that can be electrically erased and reprogrammed. Flash memory is relatively inexpensive and can be useful wherever a significant amount of non-volatile, solid-state storage is needed. Memory cards primarily use flash memory. Compact flash (CF) was originally developed as a type of data storage device used in portable electronic devices. Flash memory devices are non-volatile and solid state. CF devices are used in handheld and laptop computers digital cameras, and a wide variety of other devices, including portable audio recorders and desktop computers. The only difference between CF Type I and CF Type II cards is the card thickness. Compact flash cards are designed with flash technology and provide a nonvolatile storage that does not require a battery to retain data indefinitely.

Flash memory is also used in universal serial bus (USB) flash drives and can be used for general storage and transfer of data between computers. USB flash drives are NAND-type flash memory data storage devices integrated with a universal serial bus (USB) interface. USB flash drives are small, lightweight, removable and rewritable. USB flash drives presently have memory capacities from 32 megabytes up to 64 gigabytes. USB flash drives are more compact, generally faster, hold more data, and are more reliable, due to both their lack of moving parts, and their more durable design, than floppy disks. A flash drive consists of a small printed circuit board encased in a plastic or metal casing, making the drive sturdy enough to be carried about in a pocket, as a key fob, or on a lanyard. Only the USB connector protrudes from this protection, and is usually covered by a removable cap. Most flash drives use a standard type-A USB connection allowing them to be connected directly to a port on a personal computer. To access the data stored in a flash drive, the drive must be connected to a computer, either by plugging it into a USB host controller built into the computer, or into a USB hub. Flash drives are active only when plugged into a USB connection and draw all necessary power from the supply provided by that connection. There typical parts of a flash drive are: (1) Male type-A USB connector that provides an interface to the host computer; (2) USB mass storage controller that implements the USB host controller and provides a linear interface as well as contains a small RISC microprocessor and a small amount of on-chip ROM and RAM; (3) NAND flash memory chip that stores data; and (4) crystal oscillator that produces the flash drive's clock signal and controls the device's data output through a phase-locked loop. Flash drives are also a relatively dense form of storage, where even the cheapest will store dozens of floppy disks worth of data. Significantly, the memory density of flash memory in compact flash (CF) memory cards and USB flash drives, limits its capacity and performance. Furthermore, flash memory devices, such as compact flash (CF) memory cards and USB flash drives can sustain only a limited number of write and erase cycles before failure.

It is, therefore, desirable to provide a storage device with high-density memory, which overcomes most, if not all of the preceding disadvantages.

BRIEF SUMMARY OF THE INVENTION

A piezoactuated large array of ultrananocrystalline diamond (UNCD® brand) tips integrated with ferroelectric or phase change memory media provides alternative data storage approaches that are competitive in capacity and reliability with the technologies discussed above.

This invention provides a low voltage piezoactuated storage device and process for its fabrication, equipped with an integrated large density array of nanotips made of wear-resistant conductive UNCD. Important advantages of the inventive device are: a) the piezoactuation of the tips to make contact with the memory media, via a piezoelectric thin film, is achieved with ≦3 volts, thus providing a significant feature of driving the device with integrated complementary metal-oxide semiconductor (CMOS) devices; b) the tips made of UNCD (diamond) do not wear upon a multitude of cycles, e.g. billions of cycles, of impacting on the surface of the memory media, contrary to similar proposed devices where the tips are made of Si or other materials that are not as hard as diamond (the hardest known material); c) UNCD is the only diamond film that can be deposited at ≦400° C., which is important for achieving monolithic integration of the UNCD tips with the CMOS driving device, since growth of diamond to fabricate the tips needs to be within the thermal budget of the CMOS devices to avoid destruction of such; d) the piezoelectric film is deposited also with a low temperature process compatible with CMOS to enable full integration of the hybrid piezo/UNCD large tip array with CMOS. Thus, the proposed storage device and process for its fabrication can be implemented using available technologies, resulting in a compact, portable and efficient data storage device. Desirably, the user friendly piezoactuated storage device provides a high-density memory in the gigabit (Gb) to terabit (Tb) range which can be used both in government and commercial applications for stand alone memories and embedded memories for multifunctional electronic devices, such as cell phones with image, video, and voice recording, portable movie systems, computers, hand held electronic devices and other systems that require high-density memories in the gigabit (Gb) to terabit (Tb) range. It may also be useful for hard drives, disc drives or other computer storage and/or memory functions. The inventive piezoactuated storage device and process has achieved unexpected surprisingly good results.

The user-friendly piezoactuated storage device comprises the following components:

1) A piezoelectrically actuated UNCD tip array (see schematics) comprising of UNCD tips in a symmetric square array, a Pt or other oxidation resistant metal layer or conductive oxide (e.g., $SrRuO_3$) layer (bottom electrode) on top of the tips, patterned as parallel stripes crossing over all tips in parallel rows of the square array, a layer of piezoelectric material (e.g., $Pb(Zr_xTi_{1-x})O_3$ (PZT), AlN, or any other piezomaterial) grown as a blanket film on the parallel bottom electrode stripes and on top of the UNCD layer with an oxygen diffusion barrier film (e.g., TiAl or TaAl alloy), to avoid chemical etching of the UNCD carbon layer that would be etched by oxygen during growth of the piezolayer at high temperature in oxygen, and finally, an array of parallel electrically conductive stripes (similar to the bottom electrode stripes) grown on top of the piezoelectric layer, but arranged at 90 with respect to the orientation of the parallel bottom electrode stripes. This arrangement of layers enables the application of half a voltage on a set of parallel stripes and the other half voltage on the 90 et of parallel stripes to achieve the full voltage, necessary for inducing polarization-piezoelectric deformation of the piezoelectric layer lattice, at the point where the bottom and top electrode strips cross on one tip. In this way, each tip can be actuated independently in a random scheme to make the tip contact the storage media on the surface of the substrate underneath the tip array.

2) A layer (data storage media) deposited on a substrate (e.g. Si or any other appropriate cost efficient substrate) positioned underneath the tip array, on which the tips make contact to deliver a voltage pulse or a current pulse. In the case of UNCD tip array integration with a ferroelectric layer, the tip delivers a voltage pulse such as in about $10^{-9}$ seconds (nanoseconds) on the ferroelectric layer, which storages information via polarization of the material (i.e., displacement of positive and negative ions in opposite 180° direction in the unit lattice to establish the polarization). In the case of integration of the UNCD tip array with the phase change memory media, the tip delivers a current pulse that heats the media such as to about 610° C. in about 10-20 nanoseconds to induce a transition of the media from a crystalline (low electrical resistance) to an amorphous (high electrical resistance) state (after heating the material with a current pulse and cooling to room temperature in nanoseconds). In the PCM data storage approach, the data storage is in terms of the imprinted electrical resistance in the media, with the high and low resistance providing the two bi-stable data storage needed for a binary memory system.

Desirably, the piezoactuated storage device comprises a memory storage structure involving a microelectromechanical system (MEMS) and/or a nanoelectromechanical (NEMS) system for providing large array of tips to enable memory storage with high density in the gigabit (Gb) to terabit (Tb) range. In the illustrated embodiment, the substrate comprises silicon (Si) and the upper and/or lower metallic strips comprise platinum (Pt) or an oxidation-resistant metal or conductive oxide. The piezoactuated assembly preferably has moveable conductive UNCD tips (actuated by a piezoelectric layer sandwiched between top and bottom electrode strips, all deposited on top of the UNCD tips), including an oxygen diffusion barrier layer comprising (e.g., TiAl or TaAl) grown between the lower metallic strips and the UNCD surface to inhibit oxygen-induced etching of the carbon based UNCD layer during growth of the piezoelectric layer in oxygen.

In one preferred embodiment, the memory layer of the piezoactuated storage device comprises a polarizable memory layer, such as a ferroelectric layer and/or a piezoelectric actuation layer, both of which can be of the same material, since ferroelectric materials are also piezoelectric (e.g., $PbZr_xTi_{1-x}O_3$ (PZT), $BaTiO_3$, or any other ferroelectric/piezoelectric material). Information can be stored in the piezoactuated storage device by imprinting information on the memory media as described above.

In order to imprint a unit of information "1" on the polarizable memory layer of the piezoactuated storage device, a ½ voltage (of the appropriate sign) is applied to the top electrode strips on the polarizable piezoelectric layer on top of the UNCD tips, and a ½ voltage (of the opposite sign applied to the top electrode strips) is applied to the bottom electrode strips, to produce a full voltage pulse across the piezoelectric layer at the point of crossing of the top and bottom electrode strips, to produce the piezo-induced deformation of the layer, thus actuation to move the UNCD tip. The tip is thus brought in contact with the ferroelectric memory layer, and a voltage pulse of a determined sign, either positive or negative is applied through the tip on the surface of the ferroelectric memory layer, with respect to the electrode layer underneath the ferroelectric layer to induce polarization in the latter, thus data storage. The conductive UNCD tip acts as the top electrode of the memory media to apply a voltage pulse with respect to a bottom electrode layer grown underneath the ferroelectric layer to produce the capacitor-type structure needed to induce polarization.

In order to imprint a unit of information "0" on the polarizable memory layer of the piezoactuated storage device, voltage pulses, similarly as described above for imprinting unit of information "1" are applied between the top and bottom electrodes of the piezoelectric layer on top of the UNCD tips to bring the tip in contact with the memory medial layer. However, now, the voltage pulse applied between the bottom electrode on top of the UNCD tip and the electrode layer underneath the ferroelectric memory media is of the opposite sign as that used to imprint the unit of information "1" above, so then the ferroelectric memory layer is polarized in a reverse 180° direction to imprint the unit of information "0".

Information can be read in the polarizable memory media by putting the UNCD tips in contact with the polarizable memory layer; inverting the polarization of the polarizable memory layer to determine whether the direction that the memory layer was polarized was positive or negative; detecting an information "1" for a positive polarization of the memory layer; and detecting an information "0" for a negative polarization of the memory layer.

In another preferred embodiment, the memory layer of the piezoactuated storage device comprises a phase change memory layer made a phase change material exhibiting two orders of magnitude difference in electrical resistance between amorphous and crystalline phases. Information can be imprinted on the phase change memory layer of the piezoactuated storage device by current pulse-induced heating of the phase change memory material of the memory layer. This can be accomplished by contacting the UNCD tips with the phase change memory layer and applying a high-intensity nanosecond duration current pulse to the phase change memory layer. The phase of the memory layer will change from a crystalline phase to a high electrical resistance amorphous phase in response to the high-intensity nanosecond duration current pulse that heats the material to high temperature (~610° C.) and let it cool down rapidly (also in nanoseconds) to induce the amorphous state. A longer low-intensity current pulse can be applied to the phase change memory layer in order to change the phase of the memory layer from the high-electrical resistance amorphous phase to a crystalline phase having about three orders of magnitude lower electrical resistance than the amorphous phase. The longer lower-intensity current pulse is of a longer duration and a lower intensity than the high-intensity nanosecond duration current pulse. Advantageously, the piezoactuated storage device provides non-volatile memory performance in response to the difference in resistance between the high-electrical resistance amorphous phase and the crystalline phase of the memory layer.

Preferably, the large density piezoactuated storage device with a tip array and a memory media can be fabricated by: photolithographing the surface of a silicon (Si) wafer to define regions of substantially microscale or nanoscale square or rectangular regions; etching the regions on the surface of the silicon wafer to produce substantially pyramidal etch pits by anisotropic etching or chemical etching with potassium hydroxide (KOH); growing an oxide layer on a top surface of the silicon wafer and in the etch pits to produce oxidation sharpening of the etch pits; forming an array of conductive tips by deposition of a nanocarbon film of nanostructured carbon material of ultrananocrystalline diamond (UNCD), ta-C, or diamond-like carbon films; forming an oxygen diffusion barrier layer by deposition of a TiAl, TaAl, or any other oxygen diffusion barrier layer on the nanocarbon film; providing a bottom electrode by deposition of platinum (Pt) or other oxidation-resistant metal, or conductive oxide layer over the oxygen diffusion barrier and over the top part of the array of tips; photolithographing and reactive ion etching the bottom electrode to define substantially parallel lower metallic strips; growing a piezoelectric layer over the bottom patterned electrode strips; forming a parallel array of stripes on top of the piezoelectric layer (top electrodes) by deposition of platinum (Pt) or other oxidation-resistant metal, or conductive oxide layer over the piezoelectric tip-actuation layer; photolithographing and reactive ion etching the top electrode to define substantially parallel upper metallic strips and arranging the upper metallic strips at about a 90° orientation with respect to the lower metallic strips; encapsulating a protection coating on the piezoactuated storage device; and etching oxide on the bottom side of silicon wafer to define at least one access opening for the conductive tips so that the conductive tips can move to make contact with the memory layer to imprint information. Preferably, the piezoactuated storage device is fabricated to form an array of ultrananocrystalline diamond (UNCD) tips.

One process for fabricating a piezoactuated storage device includes: integrating the piezoactuated UNCD tips with a polarizable ferroelectric layer in a capacitor-type structure with the memory layer formed by deposition of a polarizable memory layer and a piezoelectric actuation layer, both of them being of the same or different material, comprising $PbZr_xTi_{1-x}O_3$ (PZT) or any other ferroelectric material that also is a piezoelectric material.

Another process for fabricating a piezoactuated storage device includes: forming a piezoactuated storage device with a phase change memory by deposition of a phase change memory layer of a phase change material exhibiting two order of magnitude difference in electrical resistance between amorphous and crystalline phases.

A more detailed explanation of the invention is provided in the following detailed descriptions and appended claims taken in conjunction with the accompanying drawings.

BRIEF DESCRIPTION OF THE DRAWINGS

FIG. 2 is a diagram of steps 1-7 of a fabrication process for movable conductive ultrananocrystalline diamond (UNCD) tips and a fabrication process of a ferroelectric memory layer and step 8 illustrating integration of piezoactuated UNCD tips with a ferroelectric memory media and a chart thereof in accordance with principles of the present invention.

DETAILED DESCRIPTION OF THE INVENTION

Figure 1:
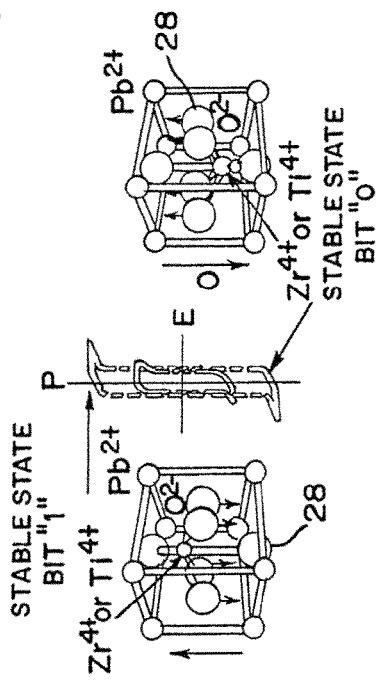
FIG. 1 is a diagram and charts of an alternative memory media for a piezoactuated MEMS/NEMS storage device in accordance with principles of the present invention.
Figure 1:
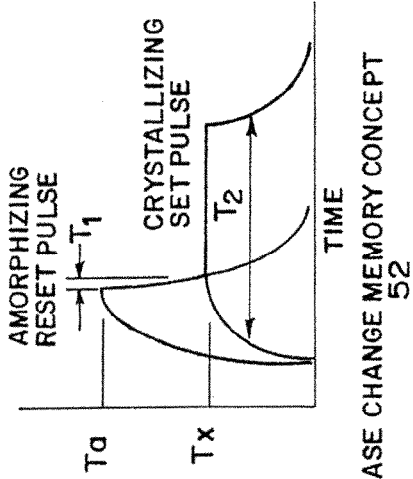

The following is a detailed description and explanation of the preferred embodiments of the invention and best modes for practicing the invention.

A compact large density memory piezoactuated storage device 10 (FIG. 2, step 8) and process for its fabrication provides an integrated large density array 12 of movable conductive nanotips 14 (tips) made of wear-resistant conductive ultrananocrystalline diamond (UNCD). Desirably, the user friendly piezoactuated storage device provides a high-density memory 16 in the gigabit (Gb) to terabit (Tb) range which can be used both in government and commercial applications for stand alone memories and embedded memories for multifunctional electronic devices that require high-density memories in the gigabit (Gb) to terabit (Tb) range, such as cell phones with image, video, and voice recording, portable movie systems, digital audio players, digital cameras, central processing units (CPU), wireless microprocessors, hardwired microprocessors, laptops, portable computers, desktop computers, digital audio players, iPods, Palm Pilots, Blackberries, MP3 players, mobile communications apparatus, and other electronic devices and systems.

The piezoactuated storage device and process for its fabrication provides an integrated microelectromechanical (MEMS) and/or nanoelectromechanical (NEMS) structure, apparatus and system 18 (FIG. 2, step 8) in which the moveable conductive ultrananocrystalline diamond (UNCD) tips are actuated via a piezoelectric layer 28 sandwiched between two electrically conductive layers (bottom electrode 32, FIG. 2, steps 2, 3, 5, 8, and top electrode 26, FIG. 2, steps 3, 4, 5, 8). The strips 26 and 32 at 90° orientation to each other form a capacitor structure with the piezoelectric layer 28 at the point of crossing. Application of a voltage between strips 26 and 32 produces a lattice deformation in the piezoelectric layer 28 that results in the piezoelectric actuation of the UNCD tips to make contact with the memory media 20 (FIG. 2, step 8). The tips of the piezoactuated storage device effectively contact an underlying ferroelectric memory layer 20 (FIG. 2, step 8). Application of a voltage pulse between the UNCD tip ant the electrically conductive layer 26 (FIG. 2 step 7) underneath the ferroelectric layer 20 (FIG. 2, step 8) produces polarization of the ferroelectric memory media 28 (same as layer 20 in FIG. 2, step 8) to imprint a unit of information. The electrically conductive layers (electrodes) can comprise platinum (Pt) or an oxidation-resistant metal, or an electrically conductive oxide.

As indicated previously, the piezoactuated storage device comprises a piezoelectrically actuated ultrananocrystalline diamond (UNCD) tip array that is integrated with a memory media for high-density data storage comprising integration of a piezoelectric/UNCD heterostructure with a ferroelectric or a phase change memory layer. The piezoactuated storage device can have a substrate 40 (FIG. 2, steps 1-8), such as silicon (Si), which provides a frame 40 that is positioned below the memory layer. The array of ultrananocrystalline diamond (UNCD) tips can be suspended from the substrate by flexible UNCD beams 44 (FIG. 2, step 6). Each of said UNCD tips can have a top part 14 (FIG. 2, STEP 6) that provides a substantially planar or flat portion 44 (FIG. 2, Step 6).

As discussed previously, the high memory piezoactuated storage device have metallic or oxide conductive layers comprising a first set of substantially parallel conductive strips disposed over the top part of the UNCD tips, a piezoelectric layer on top of the first set of parallel conductive strips, and a second set of parallel conductive strips oriented a 90 with respect to the first and disposed over the piezoelectric layer, such as to provide the application of voltages pulses across the piezoelectric layer to induce polarization, thus piezoelectric actuation via the physical deformation of the piezoelectric layer. The piezoactuation induces displacement of the UNCD tips to make contact with the memory media disposed on the substrate underneath the UNCD tip array. The piezoactuated layer can include an oxygen diffusion barrier layer comprising (e.g. TiAl or TaAl) 50 (FIG. 2, step 2, 3, 5, and 8) that is positioned between the metallic strips (bottom electrode for the piezoelectric layer) and the UNCD surface that constitutes the top of the tips.

The memory layer can comprise a ferroelectric thin film, which imprints units of data via the polarization of the ferroelectric layer in the nanoscale regions where the UNCD tip makes contact to deliver the voltage pulses. The memory layer is comprised of a ferroelectric film such as $PbZr_xTi_{1-x}O_3$(PZT) or any other polarizable ferroelectric material.

An alternative memory media to the ferroelectric layer 28 (FIG. 1) can be phase change layer 52 (replacing the ferroelectric layer 20 in FIG. 2, Step 8) comprising a phase change material, In one preferred embodiment, the phase change material exhibits two orders of magnitude difference in electrical resistance between amorphous and crystalline phases. Information can be imprinted on the phase change memory layer of the piezoactuated storage device by current pulse-induced heating of the phase change memory material of the memory layer. This can be accomplished by contacting the UNCD tips with the phase change memory layer and applying a high-intensity nanosecond duration current pulse to the phase change memory layer. The phase of the memory layer will change from a crystalline phase to a high electrical resistance amorphous phase in response to the high-intensity nanosecond duration current pulse that produce heating and cooling in nanoseconds. A longer low-intensity current pulse can be applied to the phase change memory layer in order to change the phase of the memory layer from the high-electrical resistance amorphous phase to a crystalline phase having about three orders of magnitude lower electrical resistance than for the amorphous phase. The longer lower-intensity current pulse is of a longer duration and a lower intensity than the high-intensity nanosecond duration current pulse. The non-volatile memory performance is based on the difference in resistance between the high-electrical resistance amorphous phase and the crystalline phase of the memory layer.

The UNCD-Tip/Ferroelectric media memory works in the following way:

1. The UNCD tips can be arranged in a regular array where the tips are suspended from a substrate (frame) made of an appropriate material, e.g. silicon (Si), via flexible beams made of UNCD (FIG. 2, step 6).
2. An array of parallel strips of a metal (e.g. platinum (Pt)) or conductive oxide (e.g., $SrRuO_3$), can be deposited such that they pass over the flat top part of the UNCD tip and provide the bottom electrode of the piezoelectric heterostructure for actuation (FIG. 2, step 2).
3. A piezoelectric (actuator via lattice deformation) thin film can be deposited over the whole (entire) substrate covering the parallel metallic strips (bottom electrodes) and the UNCD layer underneath, which provides the media for fabrication of the tips (FIG. 2, step 3).
4. A second array of parallel conductive strips (top electrodes) of the same material as the bottom strips can be deposited on top of the ferroelectric layer at a 90° orientation with the bottom parallel strip (FIG. 2, step 4), such that the bottom and top strips crossing at the point where the top part of a single tip in the array is located form a piezoelectric capacitor structure. Upon application of ½ positive voltage pulse on all parallel top metal strips, with respect to ground (the ferroelectric layer under the tip) and ½ voltage pulse on all the bottom metal strips (electrodes), needed to produce a full voltage pulse across the piezoelectric actuation layer at the point of crossing of the top and bottom strips (electrodes), the polarization of the piezoelectric layer produce a lattice deformation and actuation to move the tip and put it in contact with the underlying polarizable ferroelectric media (FIG. 1) to imprint a unit of information "1". A negative voltage pulse with respect to the grounded ferroelectric memory layer polarizes the latter in the reverse 180° direction to imprint the unit of information "0"

5. The reading of information can be performed by putting the tip in contact with the polarized region and inverting the polarization or not to determine what direction the ferroelectric memory layer was polarized.
6. An alternative memory media can be provided by a phase change material (FIG. 1). Upon application of a high-intensity nanosecond duration current pulse, when the tip makes contact with the material, the latter changes from a crystalline to an amorphous phase, which exhibit high-electrical resistance. Upon application of a subsequent longer low-intensity current pulse, the material changes from the high-electrical resistance amorphous phase to a crystalline phase with about three orders of magnitude lower electrical resistance than for the amorphous phase. This resistance difference between the two material phases provides the non-volatile memory performance.

A enabling feature of this invention is the unique integration of dissimilar materials such as piezoelectric and ferroelectric oxides, or phase change materials, with ultrananocrystalline diamond to a produce high-density (Gb-Tb) memory and information storage devices.

The tip array can be fabricated following the process steps described hereinafter:

1. Photolithography can be used to define micro or nanoscale square regions on the surface of the silicon (Si) wafer.
2. Chemical etching with potassium hydroxide (KOH) can produces pyramidal etch pits on the square regions defined on the surface of silicon wafer by anisotropic etching.
3. Growth of oxide layer on top surface of silicon (Si) wafer and in pits to produce oxidation-sharpening of etch pits.
4. Deposition of a particular nanostructured carbon material (either UNCD, or ta-C, or other diamond-like carbon films) (FIG. 2, step 1).
5. Deposition of a TiAl or TaAl or any other oxygen diffusion barrier layer on the nanocarbon film, followed by deposition of a platinum (Pt) or any other oxidation-resistant metal layer, or a conductive oxide layer to fulfill the function of a bottom electrode (FIG. 2, step 2).
6. Photolithography and reactive ion etching to define the parallel electrically conducting strips that cross over the top of the tips.
7. Deposition of piezoelectric layer, e.g. lead zirconium titanium oxide ($PbZr_xTi_{1-x}O_3$) (PZT) or any other piezoelectric layer, on top of the electrically conducting strips and deposition of the same oxidation-resistant metal or conductive oxide layers, as for the bottom strip electrodes, to fulfill the function of top electrode (FIG. 2, step 3).
8. Photolithography and reactive ion etching to define parallel electrically conductive strips over the piezoelectric layer that cross over the top of the tips at 90° with respect to the bottom parallel strips (FIG. 2, step 4).
9. Deposition of an encapsulating protection coating.
10. Etching of oxide on bottom side of the silicon (Si) wafer to open access to the UNCD tips (FIG. 2, step 5) and free them to enable motion via piezoelectric actuation.

Fabrication of the ferroelectric memory media can be accomplished by deposition of a ferroelectric layer on an electrically conductive layer (same materials as for the electrodes produced for piezoelectric actuation can be used) grown on the surface of silicon (Si) substrate positioned underneath the UCND tip array. Information is imprinted via polarization of the ferroelectric layer upon contact of the UNCD tip on the top of the ferroelectric and application of a voltage pulse between the tip (top electrode) and the electrically conductive layer (bottom electrode) underneath the ferroelectric layer (FIG. 2, step 7).

Fabrication of a phase change memory media can be accomplished by deposition of a electrically conductive layer (e.g., same as for the embodiment of the ferroelectric-based memory on the Si substrate, followed by deposition of a phase change memory layer. The whole layered structure is grown on a silicon (Si) wafer to define the phase change memory structure. Information is imprinted via current pulse-induced heating of the phase change memory material upon contact of the UNCD tip on the phase change layer and application of a current pulse circulating from the conducting UNCD tip (top electrode) to the electrically conductive layer underneath the phase change film (FIG. 2, step 7). In this embodiment, the ferroelectric layer is replaced by the phase change memory layer.

Phase-change memory is also known as PCM, PRAM, Ovonic Unified Memory or Chalcogenide RAM (C-RAM). The phase change memory can be non-volatile, using the unique behavior of chalcogenide glass that can be changed between two states, crystalline and amorphous, with the application of heat. The crystalline and amorphous states of chalcogenide glass can have dramatically different electrical resistivity values, and this forms the basis by which data is stored. The amorphous high resistance state is used to represent a binary 0, and the crystalline, low resistance state represents a 1. Chalcogenide is sometimes utilized in re-writable optical media, such as CD-RW and DVD-RW. In those situations, the material's optical properties are manipulated, rather than its electrical resistivity, as chalcogenide's refractive index also changes with the state of the material.

Phase change memory material can comprise a chalcogenide alloy of germanium, antimony and tellurium (GeSbTe) (GST). The GST phase change memory material can be heated to a high temperature, such as over 600° C., at which point the chalcogenide becomes a liquid. Once cooled, the GST phase change memory material can be frozen into an amorphous glass-like state and its electrical resistance is high. By heating the chalcogenide to a temperature above its crystallization point, but below the melting point, it will transform into a crystalline state with a much lower resistance. This phase transition process can be completed very quickly, e.g. in 2-5 nanoseconds. Because phase change memory media is not based on maintaining a floating charge in the cells, phase change memory can be better for archival storage than flash memory.

The GST based phase change memory layer can comprise a chip that contains a grid of millions of identical structures, called memory cells. Each cell can be made of a sliver of GST plus an electronic component, such as a transistor or diode, for controlling current through the phase change material. In particular, the cell can include a tiny bar of electrically resistive material to enable rapid heating. The cell can be encased in thermally and electrically insulating material to prevent waste of heat or current. The cell serves as a single data bit.

Jolts of electric current or light can trigger the reversible crystal-to-amorphous structural change. The electric jolt instantly melts the patch of chalcogenide, and when the nanoseconds-long zap ends, the patch's temperature plummets so quickly that the jumbled atoms freeze in place before they can snap back into crystalline order. A slightly longer, less-intense jolt of current warms, but doesn't melt, the amorphous chalcogenide patch. The technique takes advantage of the greater stability and lower energy of the crystalline state. The warmth mobilizes the atoms of the amorphous state just enough so that they can rearrange themselves into an orderly lattice. For reading back the recorded information, differences in electrical resistance reveal whether bits are amorphous or crystalline, or "0"s or "1"s.

Micro/nanoelectromechanical systems (MEMS/NEMS) with diamond with very high Young's modulus and negligible surface adhesion, on contact, can yield high performance MEMS/NEMS devices. Fabrication of diamond-based devices can include growth of diamond films on appropriate substrates followed by photolithography and etching to release moving structures (e.g., cantilevers, beams). Ultrananocrystalline diamond (UNCD) exhibits superior mechanical and tribological properties combined with smoother surface morphology (~4-7 nm rms roughness) and a lower diamond deposition temperature (~400° C.) compared with single crystal diamond, microcrystalline diamond (MCD), nanocrystalline diamond (NCD), and diamond-like (DLC) films. UNCD films can be grown on substrates exposed to argon (Ar)-rich methane ($CH_4$) microwave plasmas, which yields 2-5 nm diamond grains and 0.4 nm wide grain boundaries with $sp^3$ and $sp^2$ bonding NCD films grown with hydrogen-rich/methane ($CH_4$) plasmas yield films with 30-100 nm grain sizes. UNCD exhibits a unique combination of high fracture strength (~5.4 GPa) and Young modulus (~990 GPa), low stress (~50-80 MPa)$^2$, excellent chemical inertness, high electric field-induced electron emission, and surface functionalization that makes it bio-inert and biocompatible for application to biosensors, and biomedical devices. However, MEMS/NEMS devices based on UNCD and other materials, such as silicon (Si), are generally actuated electrostatically, which can require higher voltages (~20 volts).

Piezoelectric $Pb(Zr_xTi_{1-x})O_3$ (PZT) films have excellent piezoelectric and electromechanical coupling coefficients and high remnant polarization. The high-force generated from a piezo-layer upon application of voltage between the top and bottom electrodes sandwiching that PZT layer yields efficient micro/nanoactuators. The piezoelectric coupling coefficients of PZT films are much higher ($d_{31}$=−59 pC/N, $e_{31,F}$=−8 to −12 C/m$^2$ for epitaxial films) than those of other piezoelectric materials, such as zinc oxide (ZnO) ($e_{31,F}$=−1 C/m$^2$ surface acoustic wave (SAW) to $e_{31,F}$=−0.6 C/m$^2$ MEMS deflective measurements) or aluminum nitride (AlN) ($d_{3,f}$=−1.98 pC/N, $e_{3,f}$=−1.05 C/m$^2$). Piezoelectric actuation using PZT films can be achieved with low voltages, e.g. ≦10 volts) depending on film thickness. PZT has much lower Young modulus (80 GPa) than UNCD (980 GPa).

Reliable integration of PZT films with diamond layers for MEMS were not previously achieved due to high thermal expansion mismatch between PZT and diamond and stress in the PZT layer. Also, deposition of PZT films in oxygen>500° C. on diamond can result in chemical etching due to oxygen/carbon atoms reaction, forming volatile $CO/CO_2$ species. PZT/UNCD integration can be achieved by using titanium aluminum (TiAl) or tantalum aluminum (TaAl) (either of which is sometimes referred to as "TA") layers with dual functionality as oxygen diffusion barrier and adhesion layers interposed between the PZT and UNCD layers. The TA barriers can be chosen based on thermodynamic arguments so that oxygen atoms react preferentially with titanium (Ti), tantalum (Ta) and aluminum (Al) to form stable oxides due to the lowest energy of oxide formation for these elements with respect to all other elements in the periodic table.

Materials integration can involve the following steps: (1) growth of μm thick UNCD layer on a silicon (Si) substrate; (2) fabrication of UNCD cantilevers, via photolithography, to define the cantilever structure and reactive ion etching (a standard process for fabrication of Si-based microchips or Si-based MEMS devices) to etch the UNCD layer to define the cantilevers; (3) growth of a TA barrier layer on the UNCD film; (3) growth of platinum (Pt) or other metallic or conductive oxide layer on top of the TA barrier; (4) growth of a $PbZr_{0.47}Ti_{0.53}O_3$ (PZT) or other piezoelectric layer, via sputter-deposition, or via MOCVD or any other deposition technique suitable to produce oxide piezoelectric layer (alternatively, the piezoelectric layer can be produced with other materials such as AlN); (5) growth of the top platinum (Pt) or other metallic or oxide conductive layer to provide a Pt/PZT/Pt capacitor-like structure for piezo-actuation via voltage application between the top and bottom electrode layers.

X-ray diffraction (XRD) analysis of the $PbZr_{0.47}Ti_{0.53}O_3$ (PZT) layer grown on the Pt/TaAl/UNCD heterostructure shows a preferential (001) orientation. This PZT layer yielded capacitors with well-saturated polarization in the 5-9 volt range. A cross-section high-contrast TEM image of the Pt/PZT/Pt/TaAl/UNCD/SiO$_2$/Si heterostructure was recorded at an energy electron loss of 60 eV. Energy filtered TEM yielded elemental maps for Si, C, Ti, and 0 to produce line scans. A dark strip at the UNCD/SiO$_2$ interface was attributed to a $sp^2$-rich bonding region transitioning into the $sp^3$-rich (diamond) characteristic of the UNCD layer. A sharp boundary was observed at the TA barrier/UNCD interface and was indicative of excellent barrier performance of the TA film. Analysis showed no inter-diffusion across the layers. The TA layer became oxidized due to oxygen diffusion through the grain boundaries of the platinum (Pt) bottom electrode layer during growth of the PZT film.

Among the many advantages of the piezoelectrically actuated ultrananocrystalline diamond tip array integrated with ferroelectric or phase change media. are:
1. Superior high-density memory in the gigabit (Gb) to terabit (Tb) range.
2. Superb capabilities for multifunction electronic devices for inputting and storing data, graphics, photographs, voice recordings, videos and/or movies.
3. Enhanced large-density memory based on microelectromechanical (MEMS) and/or nanoelectromechanical (NEMS) systems.
4. Excellent stand alone memory.
5. Better memory for cell phones, portable movie systems, and other electronic devices and systems.
6. Outstanding performance.
7. Reliable.
8. Readily transportable.
9. Light weight.
10. Portable.

11. User friendly.
12. Easy to use.
13. Durable
14. Economical.
15. Attractive.
16. Efficient.
17. Effective.

Although embodiments of the invention have been shown and described, it is to be understood that various modifications, substitutions, and rearrangements of parts, components, and/or process (method) steps, as well as other uses of the piezoelectrically actuated ultrananocrystalline diamond tip array integrated with ferroelectric or phase change media, can be made by those skilled in the art without departing from the novel spirit and scope of this invention.

What is claimed is:

1. A process for fabricating a piezoactuated storage device having a tip array and a memory media, comprising the steps of:
    photolithographing a surface of a silicon (Si) wafer to define regions of substantially microscale or nanoscale square or rectangular regions;
    etching the regions on the surface of the silicon wafer to produce substantially pyramidal etch pits by anisotropic etching or chemical etching with potassium hydroxide (KOH);
    growing an oxide layer on a top surface of the silicon wafer and in the substantially pyramidal etch pits to produce oxidation sharpening of the substantially pyramidal etch pits;
    forming an array of conductive tips of a nanocarbon film of nanostructured carbon material by deposition, said nanostructured carbon material being selected from the group consisting of: ultrananocrystalline diamond (UNCD), ta-C, and diamond-like carbon films;
    forming an oxygen diffusion barrier layer by deposition of a TiAl, TaAl, or any other oxygen diffusion barrier layer material on the nanocarbon film;
    providing a bottom electrode by deposition of platinum (PT), or other oxidation-resistant metal, or a conductive oxide layer, over the oxygen diffusion barrier layer and over the top part of the array of conductive tips;
    photolithographing and reactive ion etching the bottom electrode to define substantially parallel lower metallic strips;
    forming a piezoelectric layer by deposition of a piezoelectric thin film over the bottom electrode;
    forming a top electrode by deposition of platinum or other oxidation-resistant metal, or a conductive oxide layer, over the piezoelectric layer;
    photolithographing and reactive ion etching the top electrode to define substantially parallel upper metallic strips and arranging the upper metallic strips at about a 90° orientation with respect to the lower metallic strips;
    encapsulating a protection coating on the piezoactuated storage device; and
    etching oxide on the bottom side of silicon wafer to define access at least one opening for the conductive tips so that the conductive tips can move in contact with the memory layer to imprint information in the piezoactuated storage device.

2. A process for fabricating a piezoactuated storage device in accordance with claim 1, including:
    forming a ferroelectric/electrically conductive heterostructure; and wherein
    said memory layer is formed by deposition of a polarizable memory layer selected from the group consisting of a ferroelectric layer comprising $PbZr_xTi_{1-x}O_3$ (PZT) or any other polarizable ferroelectric material.

3. A process for fabricating a piezoactuated storage device in accordance with claim 1, including:
    forming a piezoactuated storage device with a phase change memory media; and wherein
    said memory layer is formed by deposition of a phase change memory layer of a phase change material exhibiting two orders of magnitude difference in electrical resistance between amorphous and crystalline phases.

4. A process for fabricating a piezoactuated storage device in accordance with claim 1, wherein:
    said conductive tips are fabricated to form an array of tips; and
    said metal of said lower or said upper metallic strips comprises platinum (Pt) or an oxidation-resistant metal, or an electrically conductive oxide layer.

* * * * *